United States Patent
Hsu et al.

(10) Patent No.: US 7,291,916 B2
(45) Date of Patent: Nov. 6, 2007

(54) SIGNAL TRANSMISSION STRUCTURE AND CIRCUIT SUBSTRATE THEREOF

(75) Inventors: Chi-Hsing Hsu, Taipei Hsien (TW); Hsing-Chou Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 69 days.

(21) Appl. No.: 11/148,893

(22) Filed: Jun. 8, 2005

(65) Prior Publication Data

US 2006/0065434 A1  Mar. 30, 2006

(30) Foreign Application Priority Data

Sep. 30, 2004  (TW) .............................. 93129545 A

(51) Int. Cl.
*H01L 23/48* (2006.01)

(52) U.S. Cl. ...................... 257/738; 257/664; 257/698; 257/723; 257/724; 257/773; 257/774; 257/E21.511; 257/E23.174; 257/E23.175; 257/737; 257/738; 174/260; 174/262; 174/255; 361/760; 361/767; 361/768

(58) Field of Classification Search ..................... None
See application file for complete search history.

(56) References Cited

U.S. PATENT DOCUMENTS

2003/0215619 A1* 11/2003 Ooi et al. .................... 428/209

* cited by examiner

*Primary Examiner*—Sue A. Purvis
*Assistant Examiner*—Fazli Erdem
(74) *Attorney, Agent, or Firm*—J.C. Patents

(57) ABSTRACT

A signal transmission structure suitable for a multi-layer circuit substrate comprising a core layer and at least a dielectric layer is provided. The signal transmission structure according to the present invention comprises a first via landing pad and a reference plane. The first via landing pad is disposed on a first surface of the core layer, and covering one end of the through hole of the core layer. The dielectric layer covers the first via landing pad and the first surface of the core layer. And the first reference plane is disposed above the dielectric layer, having a first opening disposed above one end of the through hole. Wherein, the area where the first reference plane is projected on the first surface of the core layer does not overlap with the area where the first via landing pad is projected on the first surface of the core layer.

20 Claims, 1 Drawing Sheet

SIGNAL TRANSMISSION STRUCTURE AND CIRCUIT SUBSTRATE THEREOF

CROSS-REFERENCE TO RELATED APPLICATION

This application claims the priority benefit of Taiwan application serial no. 93129545, filed on Sep. 30, 2004. All disclosure of the Taiwan application is incorporated herein by reference.

BACKGROUND OF THE INVENTION

1. Field of Invention

The present invention relates to a signal transmission structure. More particularly, the present invention relates a signal transmission structure and a circuit substrate thereof capable of reducing the impedance mismatch of the signal transmission path.

2. Description of Related Art

The common circuit substrates are composed of alternately stacked multiple patterned-circuit layers and multiple dielectric layers. For example, the patterned-circuit layers are formed on the copper foils through the photolithography process and etching process, and a part of the non-etched copper foils can serve as a reference plane of the circuit substrates, such as a ground plane or a power plane for example. The dielectric layers are disposed between the patterned-circuit layers or the reference planes to isolate the stacked patterned-circuit layers or the reference planes. In addition, the stacked patterned-circuit layers are electrically connected to each other through the Plating-Through Holes (PTH) or the conducting vias.

As to the connection of the circuit layers, the conducting via, for example, can be fabricated by the sequential steps: forming holes on the dielectric layer by multiple photolithography process, and filling the holes with conducting materials to electrically connect at least two patterned-circuit layers. Besides, the PTH can be formed, for example, by using mechanical drilling method to drill through the stacked circuit layers and the dielectric layers or through the stacked circuit layers and a single dielectric core. And then, an electroplating layer is formed on the inner wall of the through hole by an electroplating method to electrically connect at least two patterned-circuit layers.

Please refer to FIG. 1, which schematically illustrates a cross-sectional view of a conventional circuit substrate. Take a substrate having six patterned circuit layers for example. The circuit substrate 100 has a stacked layer 110, comprising a first circuit structure 120, a core layer 130, and a second circuit structure 140. Wherein, the two via landing pads 124, 126 of the first circuit structure 120 are electrically connected by a conducting via 125. A reference plane 128 is formed on a first dielectric layer 127 above the via landing pad 126, serving as the reference of the electric potential for the signal transmission in the first circuit structure. Besides, the two via landing pads 144, 146 of the second circuit structure 140 are electrically connected by a conducting via 145. A reference plane 148 is formed on a second dielectric layer 147 above the via landing pad 146, serving as the reference of electric potential for the signal transmission in the second circuit structure. Furthermore, the core layer 130 comprises a plurality of through holes 132 conducting the first surface 130a and the second surface 130b of the core layer 130. And the inner wall of each through hole 132 is covered with a conducting wall 134 to electrically connect with the via landing pad 126 of first circuit structure 120 and with the via landing pad 146 of second circuit structure 140. The hollow part of the through hole 132 can be filled with a dielectric material 150.

In FIG. 1, the two via landing pads 126, 146 are respectively disposed, for example, on the first surface 130a and second surface 130b of the core layer 130 made of the dielectric material. And the two via landing pads 126, 146 respectively cover two ends of the through hole 132. The via landing pads 126, 146 are electrically connected by a conducting wall 134. Thus, the signals from a signal line of first circuit structure 120 can be transmitted sequentially through a connecting pad 122, the conducting via 123, the via landing pad 124 which is inside of an opening 128a formed by etching the reference plane 128, the conducting via 125, and the via landing pad 126. Then, after passing through the conducting wall 134 inside the through hole 132 of the core layer 130, the signals are transmitted through the via landing pad 146 the conducting via 145, the via landing pad 144 which is inside of the opening 148a formed by etching the reference plane 148, the conducting via 143, and the connecting pad 142. Finally, the signals are transmitted to the outside receiver connected with the connecting pad 142. The signal transmission structure described above can form a signal-transmitting path between two devices or two ends (not shown).

Noting that in the prior art, the transmitting lines in the signal-transmitting path used to electrically connect with two devices or two ends have a consistent width; that is, the electric impedance for each part of the signal-transmitting path must be kept identical such that the characteristic impedance of the signal-transmitting path is a constant while electronic signals are transmitted in the signal-transmitting path. Especially for the high-speed and high-frequency signal transmission, a well-designed signal-transmitting path between two devices or two ends is required to reduce the reflection caused by the impedance mismatch of the signal-transmitting path. In other words, the signal-transmitting quality is improved by reducing the insertion loss during signal transmission and enhancing the return loss. However as shown by the dash circles in FIG. 1, there are the overlapping areas between the via landing pad 124 and the adjacent reference plane 128 and between the via landing pad 146 and the adjacent reference plane 148 for the conventional substrates. In other words, the region where the reference plane 128 is projected on the first surface 130a overlaps the via landing pads 126; likewise the region where the reference plane 148 is projected on the second surface 130b overlaps the via landing pad 146. Thus, when the signals are transmitted, especially through the via landing pads 126 or 146, the deviation in impedance will be induced by the effect of parasitic capacitance between the reference planes 128 and 148. It also means that it aggravates the impedance mismatch of the signal transmission path.

Furthermore, when the differential signals in the signal transmission structure are transmitted through the conducting walls 134, the electromagnetic field coupling between the conducting wall 134 would affect the current circulation path and electric field, thus changing the characteristic impedance between the differential signals. Thus, when the differential signals are transmitted through the two through holes 132 and 136, the signals would reflect and deteriorate as a result of the inconsistent impedance caused by the two conducting walls. Furthermore it reduces the quality of the transmitting signals.

SUMMARY OF THE INVENTION

Accordingly, one object of the present invention is directed to a signal transmission structure providing better impedance match to improve the signal transmission quality.

Another object of the present invention is directed to a signal transmission structure capable of reducing the parasitic capacitance effect of the reference planes and of improving the impedance mismatch while the signals pass through the two via landing pads.

In order to achieve the above and other objects, the present invention provides a signal transmission structure suitable for a multi-layer circuit substrate comprising a core layer and at least a dielectric layer. The core layer comprises a first surface, a second surface, and at least a through hole conducting the first surface and the second surface. The signal transmission structure comprises a first via landing pad and a reference plane. The first via landing pad is disposed on the first surface of the core layer and covers one end of the through hole. The dielectric layer covers the first surface of the first via landing pad and the core layer. In addition, the first reference plane is disposed above the dielectric layer, having a first opening disposed above one end of the through hole. Wherein, the area where the first reference plane is projected on the first surface of the core layer doesn't overlap with the area where the first via landing pad is projected on the first surface of the core layer.

In order to achieve the above and other objects, the present invention provides a circuit substrate comprising a first circuit structure, a second circuit structure, and a core layer. The first circuit structure sequentially comprises a first via landing pad, a first dielectric layer, and a first reference plane having a first opening disposed above the first via landing pad. In addition, the second circuit structure sequentially comprises a second first via landing pad, a second dielectric layer, and a second reference plane having a second opening disposed above the second via landing pad. Besides, the core layer is disposed between the first and second circuit layers. The core layer comprises a first surface, a second surface, and at least a through hole conducting the first surface and the second surface. The first and second via landing pads are disposed on the first surface and the second surface, respectively, covering the two ends of the through hole. Wherein the area where the first reference plane is projected on the first surface of the core layer doesn't overlap with the area where the first via landing pad is projected on the first surface of the core layer. And the area where the second reference plane is projected on the second surface of the core layer doesn't overlap with the area where the second via landing pad is projected on the second surface of the core layer.

In respect to the via landing pads and adjacent reference planes according to the present invention, each position of via landing pads is totally contained by the projected area of the opening formed by etching the reference planes. In other words, the areas where the non-perfect reference planes are projected on the planes of the via landing pads do not overlap with the via landing pads. Thus, when the signal passes through the non-prefect reference planes, the impedance can be more consistent. Accordingly, the present invention is capable of reducing the signal reflection due to the impedance mismatch of signal-transmitting path in the signal transmission and enhancing the signal transmission quality.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
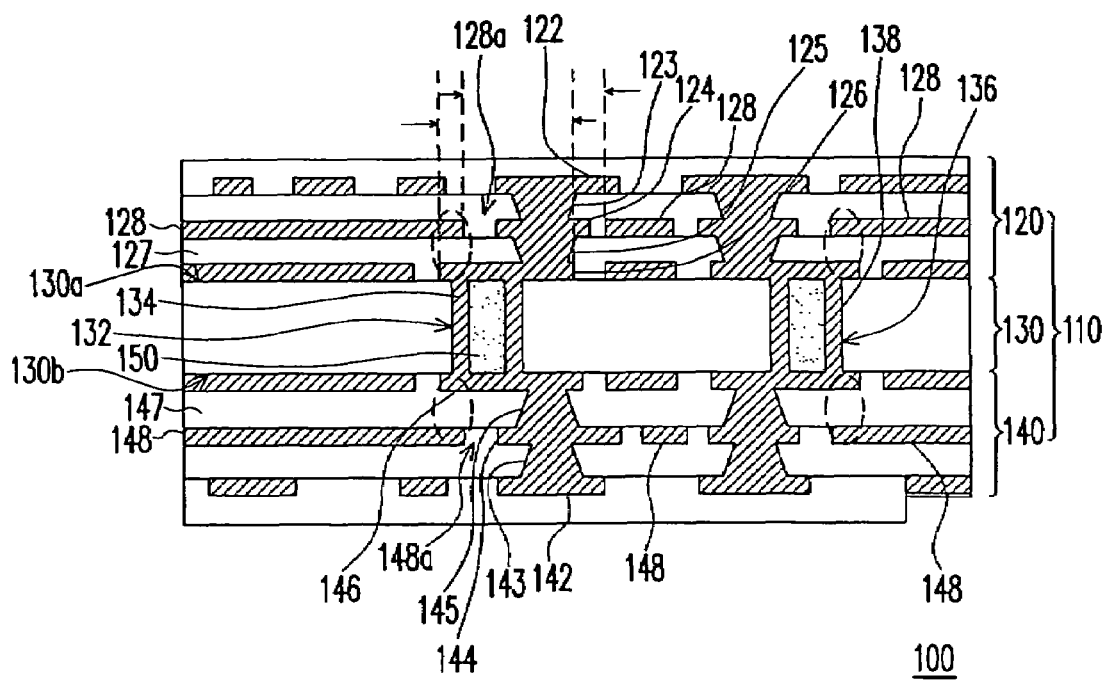
FIG. 1 schematically shows a cross-sectional view of a conventional circuit substrate.
Figure 2:
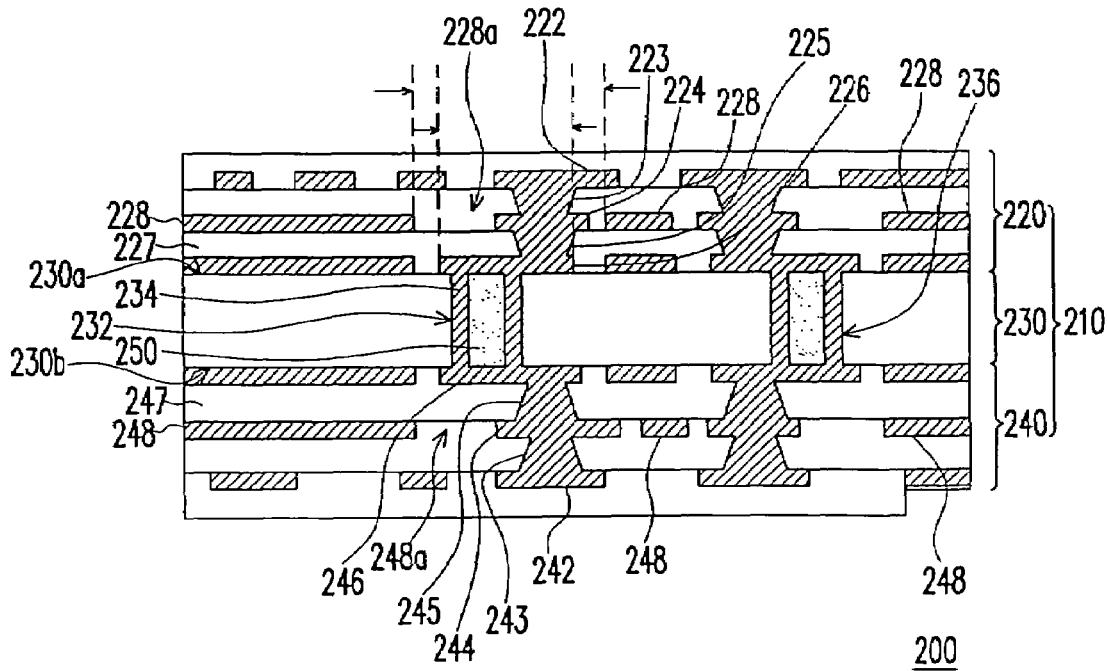
FIG. 2 schematically shows a cross-sectional view of a circuit substrate according to one embodiment of the present invention.

FIG. 2 schematically shows a cross-sectional view of a circuit substrate according to one embodiment of the present invention. Take a substrate having six patterned-circuit layers for example. The circuit substrate 200 has a stack layer 210 sequentially comprising a first circuit structure 220, a core layer 230, and a second circuit structure 240. Wherein, the two via landing pads 224, 226 of the first circuit structure 220 are electrically connected by a conducting via 225. A reference plane 228 is disposed on a first dielectric layer 227 above the via landing pad 226, serving as the reference of the electric potential for signal transmission in the first circuit structure. Besides, the two via landing pads 244, 246 of the second circuit structure 240 are electrically connected by a conducting via 245. A reference plane 248 is disposed on a second dielectric layer 247 above a via landing pad 246, serving as the reference of electric potential for signal transmission in the second circuit structure. Furthermore, the core layer 230 comprises a plurality of through holes 232 conducting the first surface 230a and the second surface 230b of the core layer 230. And the inner wall of each through hole 232 is covered with a conducting wall 234 to electrically connect with the first circuit structure 220 and the second circuit structure 240. The hollow part of the through hole 232 can be filled with the dielectric material 250.

In FIG. 2, the two via landing pads 226, 246 are respectively disposed, for example, on the first surface 230a and the second surface 230b of the core layer 230 made of dielectric materials, covering two ends of a through hole 232. The via landing pads 226,246 are electrically connected by a conducting wall 234. Thus, the signals from a signal line of first circuit structure can be transmitted sequentially through a connecting pad 222, the conducting via 223, the via landing pad 224 which is inside of an opening 228a formed by etching the reference plane 228, the conducting via 225, and the via landing pad 226. Then, after passing through the conducting wall 234 inside the through hole 232 of the core layer 230, the signals are transmitted through the via landing pad 246 and the conducting via 245, the via landing pad 244 which is inside of an opening 248a formed by etching the reference plane 248, the conducting via 243, and the connecting pad 242 of the second circuit layer 240. Finally, the signals are transmitted to the outside device or the receiver connected with the connecting pad 242. The conducting structure described above can form a signal-transmitting path between two devices or two ends (not shown).

In the present embodiment, two reference planes 228, 248, for example, can be a power plane or a ground plane, and a non-conductive area on the reference plane is formed by the drilling or etching of reference planes 228, 248, such as the openings 228 and 248a for example. Note that in order to reduce the parasitic capacitance effect of adjacent reference plane 228 and that of the adjacent reference plane 248 while the signal transmitting, especially while the signals pass through the two via landing pads 226, 246, it is a special design in the openings 228a such that the contours of the openings 228a projected on the first surface 230a can totally contain the contours of the via landing pads 226. Likewise, the specially-designed opening 248a has an area projected on the second surface 230b which contains the contours of the via landing pads 246. In other words, the projected contours of the openings 228a and the contours of the via landing pads 226 are not overlapped or crossed; likewise the projected contours of the openings 248a and the contours of the via landing pads 246 are not overlapped or crossed. On the contrary, the area where the non-prefect reference planes 228 is projected on the first surface 230a of the core layer 230 doesn't overlap with the area where the first via landing pad 226 is projected on the first surface 230a of the core layer 230. Also, the area where another non-prefect reference plane 248 is projected on the second surface 230b of the core layer 230 doesn't overlap with the area where the second via landing pad 246 is projected on the second surface 230b of the core layer 230.

It's proven by experimental data that, when signals pass through the openings of the non-prefect reference planes 228, 248 mentioned above, due to reduction parasitic capacitance effect between the via landing pad 226 and the adjacent reference plane 228 and that between the via landing pad 226 and the adjacent reference plane 248, the signal-transmitting path has more consistent impedance, and the signal reflection resulted from impedance mismatch during the signal transmission process can be reduced and the signal transmission quality can be improved.

As described above, when the differential signals pass through the conducting walls 234 inside the first through hole 232 and adjacent second through hole 236 respectively, the approximate formula of characteristic impedance of differential signals can be given by:

$$Z = \sqrt{\frac{Ls - Lm}{Cs + Cm}}$$

Z: characteristic impedance of differential signal;
Ls: equivalent inductance of signal-transmitting lines;
Cs: capacitance of reference ground end;
Lm: inductance coupling between differential signals;
Cm: capacitance coupling between differential signals.

Due to the reducing of the parasitic capacitance effect between the via landing pad 226 and adjacent non-prefect reference plane 228, the reducing of the parasitic capacitance effect between the via landing pad 246 and the adjacent non-prefect reference plane 248, and the compensated equivalent inductance of signal-transmitting lines near the through holes 232 and 236, the characteristic impedance of differential signals (Z) is increased and the signal reflection and deterioration caused by impedance mismatch are reduced when the differential signals pass through a pair of signal-transmitting paths. The embodiment fulfills the goal of impedance match. Therefore, in the high-speed and high-frequency signal transmission, the characteristic impedance can be close to the pre-determined impedance value, and the return loss of transmission structure of a pair of differential signals are also improved about 10 dB compared with the conventional design. Simultaneously, the range of operating bandwidth in high frequency can be extended and better signal-transmitting quality can be maintained.

In the above embodiment, though the through hole 232 of the core layer 230 formed by drilling through a single dielectric material is taken as an example, the through hole can also be formed by drilling through at least a dielectric layer and multiple patterned-circuit layers. In other words, the core layer 230 can include only a single dielectric layer or multiple patterned-circuit layers and at least a dielectric layer disposed among the patterned-circuit layers. Besides, in the above embodiment, the first circuit structure 220 can be a single patterned-circuit layer and the second circuit layer 240 can also be a single patterned circuit layer, used for electrically coupling external electronic devices, such as chips or printed circuit boards (PCBs).

It's known from the descriptions above that in the via landing pads and adjacent reference planes of the present invention, the position of via landing pads is totally contained by the projected area of openings formed by etching the reference planes. In other words, the areas where the non-prefect reference planes are projected on the planes of the via landing pads do not overlap with the via landing pads. Thus, when the signal passes through the non-prefect reference plane, the impedance can be more consistent. Accordingly, the present invention is capable of improving the signal reflection due to the impedance mismatch of signal-transmitting path in the signal transmission process and increasing the signal transmission quality.

To sum up, a signal transmission structure and a circuit substrate thereof according the present invention has at least the following advantages.

When a single signal or a pair of differential signals passes through the non-prefect reference planes, the impedance can be more consistent. Accordingly, the present invention is capable of reducing the signal reflection due to the impedance mismatch of signal-transmitting path in the signal transmission process and increasing the signal transmission quality.

Due to the more consistent impedance of the signal transmitting through the non-prefect reference planes, the return loss through the through holes can be improved.

Due to the more consistent impedance of the signals transmitting through the non-prefect reference planes, the insertion loss of the high-frequency signals can be reduced and the energy loss of the high-frequency signals can be lowered, too. Thus the signals in high frequency can be transmitted completely.

The signal transmission structure according to the present invention can be widely used in the applications of signal transmission, such as large-scale printed circuit boards, package substrates, etc.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A signal transmission structure, suitable for a multi-layer circuit substrate comprising a core layer and at least a dielectric layer, wherein the core layer comprises a first surface, a second surface, and at least a through hole conducting the first surface and the second surface, the signal transmission structure comprising:

a first via landing pad disposed on the first surface of the core layer, wherein the first via landing pad electrically connects with one end of the through hole, and the dielectric layer covering the first via landing pad and the first surface of the core layer; and a first reference plane disposed on the dielectric layer, the first reference plane having a first opening disposed above one end of the through hole, and the area where the first reference plane is projected on the first surface of the core layer does not overlap with the area where the first via landing pad is projected on the first surface of the core layer, wherein the first reference plane is disposed above the first via landing pad.

2. The signal transmission structure according to claim 1, further comprising a second via landing pad and a second reference plane, the second via landing pad disposed on the second surface of the core layer, electrically connecting with the other end of the through hole, the second reference plane disposed on another dielectric layer which covers the second via landing pad and the second surface of the core layer, the second reference plane comprising a second opening disposed above the other end of the through hole, and the area where the second reference plane is projected on the second surface of the core layer does not overlap with the area where the second via landing pad is projected on the second surface of the core layer.

3. The signal transmission structure according to claim 2, wherein the second reference plane is a power plane or a ground plane.

4. The signal transmission structure according to claim 2, further comprising a conducting wall disposed on the inner wall of the through hole, wherein the conducting wall having a first end electrically connected to the first via landing pad and a second end electrically connected to the second via landing pad.

5. The signal transmission structure according to claim 1, further comprising a first conducting via connected to the first via landing pad, wherein the first conducting via passes through the dielectric layer.

6. The signal transmission structure according to claim 2, further comprising a second conducting via connected to the second via landing pad, wherein the second conducting via passes through another dielectric layer.

7. The signal transmission structure according to claim 1, wherein the first reference plane is a power plane or a ground plane.

8. A circuit substrate comprising:

a first circuit structure sequentially comprising a first via landing pad, a first dielectric layer, and a first reference plane having a first opening disposed above the first via landing pad;

a second circuit structure; and a core layer disposed between the first and the second circuit structures, the core layer comprising an first surface, a second surface, and at least a through hole conducting the first surface and the second surface, wherein the first via landing pad is disposed on the first surface and electrically connects with one end of the through hole; wherein the area where the first reference plane is projected on the first surface of the core layer does not overlap with the area where the first via landing pad is projected on the first surface of the core layer, wherein the first reference plane is disposed above the first via landing pad.

9. The circuit substrate according to claim 8, wherein the first reference plane is a power plane or a ground plane.

10. The circuit substrate according to claim 8, wherein the second layer circuit structure comprises a second via landing pad, a second dielectric layer, and a second reference plane having a second opening disposed above the second via landing pad.

11. The circuit substrate according to claim 10, wherein the second via landing pad is disposed on the second surface of the core layer, electrically connecting with the other end of the through hole.

12. The circuit substrate according to claim 10, wherein the area where the second reference plane is projected on the second surface of the core layer does not overlap with the area where the second via landing pad is projected on the second surface of the core layer.

13. The circuit substrate according to claim 8, wherein the second reference plane is a power plane or a ground plane.

14. The circuit substrate according to claim 8, further comprising a conducting wall disposed on the inner wall of the through hole, wherein the conducting wall having an end electrically connected to the first via landing pad.

15. The circuit substrate according to claim 10, further comprising a conducting wall disposed on the inner wall of the through hole, wherein the conducting wall having a first end electrically connected to the first via landing pad and a second end electrically connected to the second via landing pad.

16. The circuit substrate according to claim 8, further comprising a first conducting via connected to the first via landing pad, wherein the first conducting via passes through the first dielectric layer.

17. The circuit substrate according to claim 10, further comprising a second conducting via connected to the second via landing pad, wherein the second conducting via passes through the second dielectric layer.

18. A signal transmission structure, suitable for a multi-layer circuit substrate comprising a core layer and at least a dielectric layer, wherein the core layer comprises a first surface, a second surface, and at least a through hole conducting the first surface and the second surface, the signal transmission structure comprising:

a first via landing pad disposed on the first surface of the core layer, wherein the first via landing pad electrically connects with one end of the through hole, and the dielectric layer covering the first via landing pad and the first surface of the core layer;

a second via landing pad disposed on the second surface of the core layer, wherein the second via landing pad electrically connects with the other end of the through hole;

a conducting wall disposed on the inner wall of the through hole, wherein the conducting wall having a first end electrically connected to the first via landing pad and a second end electrically connected to the second via landing pad; and a first reference plane disposed on the dielectric layer, the first reference plane having a first opening disposed above one end of the through hole, and the area where the first reference plane is projected on the first surface of the core layer does not overlap with the area where the first via landing pad is projected on the first surface of the core layer.

19. The signal transmission structure according to claim 18, further comprising a first conducting via connected to the first via landing pad, wherein the first conducting via passes through the dielectric layer.

20. The signal transmission structure according to claim 18, further comprising a second conducting via connected to the second via landing pad, wherein the second conducting via passes through another dielectric layer.

* * * * *